US005556798A

United States Patent [19]
Hong

[11] Patent Number: 5,556,798
[45] Date of Patent: Sep. 17, 1996

[54] METHOD FOR ISOLATING NON-VOLATILE MEMORY CELLS

[75] Inventor: Gary Hong, Hsin-Chu, Taiwan

[73] Assignee: United Microelectronics Corp., Hsinchu, Taiwan

[21] Appl. No.: 347,715

[22] Filed: Dec. 1, 1994

[51] Int. Cl.$^6$ .................................. A01L 21/8247
[52] U.S. Cl. .................. 437/43; 437/70; 257/316
[58] Field of Search .................. 437/43, 70, 48, 437/52; 257/316

[56] References Cited

U.S. PATENT DOCUMENTS 5,466,622  11/1995  Cappelletti ........................... 437/52

FOREIGN PATENT DOCUMENTS 6232394A  8/1994  Japan ........................... 437/43

*Primary Examiner*—Mary Wilczewski
*Assistant Examiner*—Richard A. Booth
*Attorney, Agent, or Firm*—Ladas & Parry

[57] ABSTRACT

A method of fabricating semiconductor integrated circuit non-volatile memory devices having memory cell isolation between the memory cells without increasing device dimension. Active regions are defined by forming field oxide layers on a on semiconductor substrate of a first type. Lightly-doped regions of the first type are formed underneath field oxide layers. Additional heavily-doped regions of the first type are formed within each of the lightly-doped regions. Active regions on the semiconductor substrate are implanted with impurities of a second type to form drains and sources for the memory cells. Floating gate layers are formed on tunnel oxide layers, the tunnel oxide layers separating the floating gate layers from the active regions. The presence of the lightly-doped region improves the breakdown voltage, while the additional heavily-doped regions within each of the lightly-doped regions increases threshold and punchthrough voltages for the inherent parasitic transistors of the memory device.

7 Claims, 7 Drawing Sheets

5,556,798

METHOD FOR ISOLATING NON-VOLATILE MEMORY CELLS

BACKGROUND OF THE INVENTION

1. Field of the Invention

The present invention relates in general to non-volatile memories. In particular, the present invention relates to implementing isolation for memory cells of non-volatile memory devices. More particularly, the present invention relates to a method for fabricating memory cells of non-volatile memory devices with improved isolation characteristics at restricted device dimensioning.

2. Technical Background

Memory cells within a semiconductor integrated circuit mass memory array require appropriate isolation between neighboring cells of the array. FIGS. 1–3 of the accompanying drawings show a typical prior art non-volatile memory device having multiple memory cells in the mass memory array.

In the conventional non-volatile memory device such as the one shown in plan view in FIG. 1, semiconductor substrate 1, typically a silicon substrate, is the basis for fabrication of arrays of non-volatile memory cells. As is realized by persons skilled in this art, the memory cells of the typical non-volatile memory device comprise field oxide 10, tunnel oxide 12, floating gate 14, gate dielectric 16, drain region 20, source region 22, word lines 18, and via 24 for electrical connecting to bit lines (not shown) of the memory device.

The structural configuration of such memory cells, as shown in the cross-sectional view of FIGS. 2 and 3 taken along the II—II and III—III lines in FIG. 1 respectively, however, is subjected to the disadvantageous effect of parasitic transistors that are established under field oxide 10. A conventional non-volatile memory cell employs P-type semiconductor substrate 1 to fabricate field oxide layer 10 on top of the substrate. The surrounding $N^+$-type regions 20, together with portions of the P-type semiconductor substrate 1 underneath the layer of field oxide 10 constitute N-channel parasitic transistors. Whenever a high voltage is applied to the interconnect (not shown) over the region of field oxide 10, the surrounding $N^+$-type regions 20 enter a conducting state and block the normal operation of the nearby non-volatile memory cells. Moreover, during the process of memory cell programming or erasing, $N^+$-type regions 20 are subjected to excessive electric potential sufficient to cause punchthrough in the parasitic transistors, further obscuring the normal operation of the memory cells of the non-volatile memory device.

Two solutions to the above-described problems of the disadvantageous effects caused by the inherent parasitic transistors within the memory device structural configuration were proposed in the prior art.

One solution employed field oxide layer 10 having increased thickness, for the purpose of increasing the threshold voltage of the inevitable parasitic transistor. The increase in the thickness of the field oxide layer, however, also results in the expansion of the bird's-beak of field oxide layer 10 into the active regions (namely, $N^+$-type region 20). This works against the effort of reducing the size of the memory device. Also, a thicker field oxide layer makes the surface contour of the integrated circuit device exhibit a greater gradient, which makes fabrication processing steps, such as step coverage and etching, more difficult to implement.

The other solution employed increased impurity concentration in the P-type semiconductor substrate in regions under field oxide layers 10 of the memory cells. The increased impurity concentration directly results in the increased threshold and punchthrough voltages of the inherent parasitic transistors. However, the disadvantageous side effect of this strategy is a reduction in the breakdown voltage between the $N^+$-type junction area and the P-type substrate.

SUMMARY OF THE INVENTION

It is therefore an object of the present invention to provide a method for isolating memory cells in non-volatile memory devices that allows for increased breakdown voltage in the junction of the inherent parasitic transistors of the memory cell structural configuration.

It is another object of the present invention to provide a method for isolating memory cells in non-volatile memory devices that allows for increased threshold voltage for the inherent parasitic transistors of the memory cell structural configuration.

It is still another object of the present invention to provide a method for isolating memory cells in non-volatile memory devices that allows for increased punch-through voltage for the inherent parasitic transistors of the memory cell structural configuration.

It is still another object of the present invention to provide a method for isolating memory cells in non-volatile memory devices that allows for increased isolation characteristics of the inherent parasitic transistors of the memory cell structural configuration without increasing the structural dimensions of the device.

A method of fabricating semiconductor integrated circuit non-volatile memory devices having memory cell isolation between the memory cells without increasing device dimension is provided. Lightly-doped regions of a first type are formed underneath field oxide layers. Additional heavily-doped regions of the first type are formed within each of the lightly-doped regions of the first type. Active regions on the semiconductor substrate are implanted with impurities of a second type to form drains and sources for the memory cells. Floating gate layers are formed on tunnel oxide layers, the tunnel oxide layers separating the floating gate layers from the active regions. The presence of the lightly-doped region improves the breakdown voltage, while the additional heavily-doped regions within each of the lightly-doped regions increases threshold and punchthrough voltages for the inherent parasitic transistors of the memory device.

In particular, active regions of the memory cells are defined on a semiconductor substrate of a first type by forming a masking layer. Impurities of the first type are implanted into the substrate to form lightly-doped regions of the first type in the regions exposed out of the masking layer. The masking layer is used as shielding for an oxidation procedure of the substrate to form field oxide layers of the memory cells on top of the lightly-doped regions. The masking layer is removed. A thin oxide layer is formed on top of the active regions of the memory cells. Floating gate strip layers for the memory cells are each formed on top of one of the field oxide layers and the thin oxide layer, the floating gate strip layers being divided by isolating trenches and aligned on top of the gate oxide layers with edges extending outwardly to cover a portion of the width of the field oxide layers. Impurities of the first type are implanted through the isolating trenches between the floating gate strip layers to form heavily-doped regions of the first type in the substrate, the heavily-doped regions being formed within the lightly-doped regions located underneath the field oxide layers. A gate dielectric layer and a word line polysilicon layer is formed on top of the substrate and an etching procedure is implemented against the gate dielectric and word line polysilicon layers to form independent word lines and isolated floating gate layers, the floating gate layers being covered by the word lines. Impurities of a second type are implanted into the active regions utilizing the word lines and field oxide layers as shields to form drains and sources for the memory cells.

Other objects, features and advantages of the present invention will become apparent, by way of the following detailed description of the preferred but non-limiting embodiment.

BRIEF DESCRIPTION OF THE DRAWINGS

The description of the invention is made with reference to the accompanied drawings, wherein.

DETAILED DESCRIPTION OF THE PREFERRED EMBODIMENT

Figure 1:
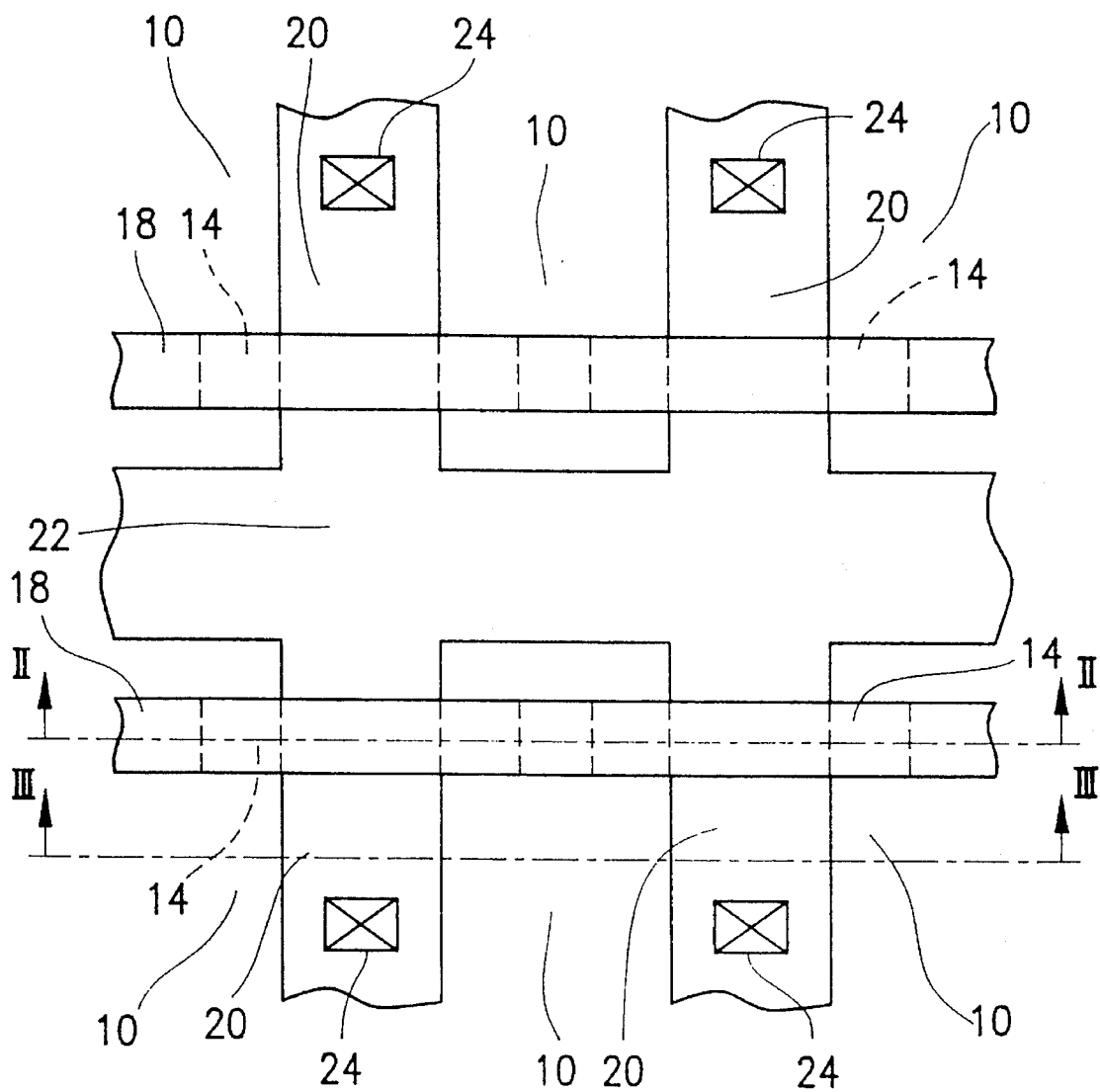
FIG. 1 is a plan view of a conventional prior art non-volatile memory showing memory cells.
Figure 2:
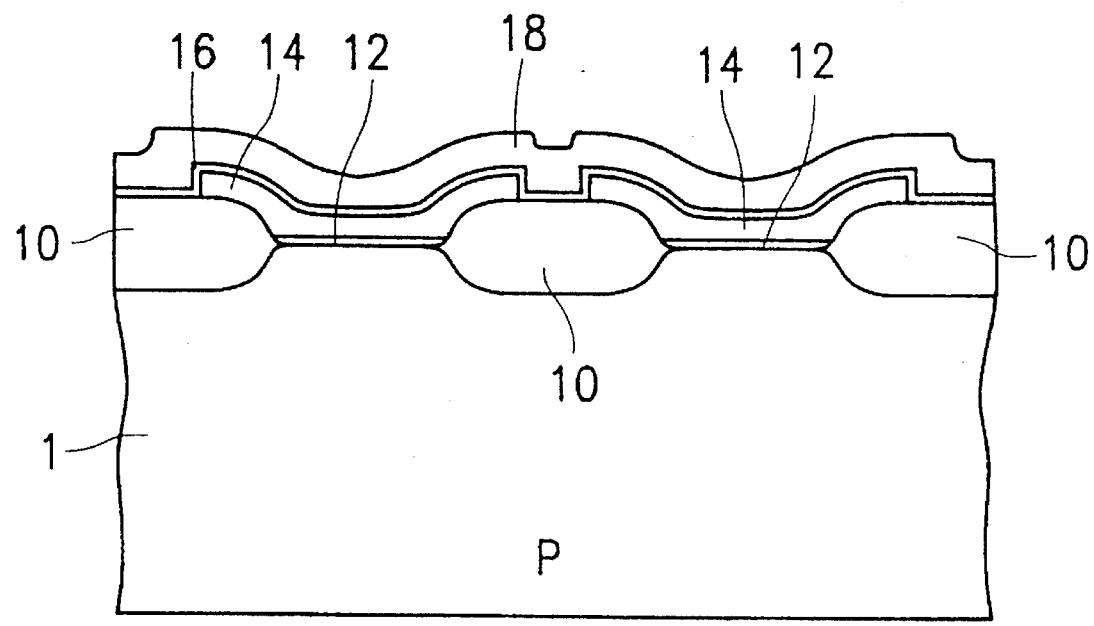
FIG. 2 shows the cross-sectional view of the conventional prior art non-volatile memory of FIG. 1 taken along the II—II line.
Figure 3:
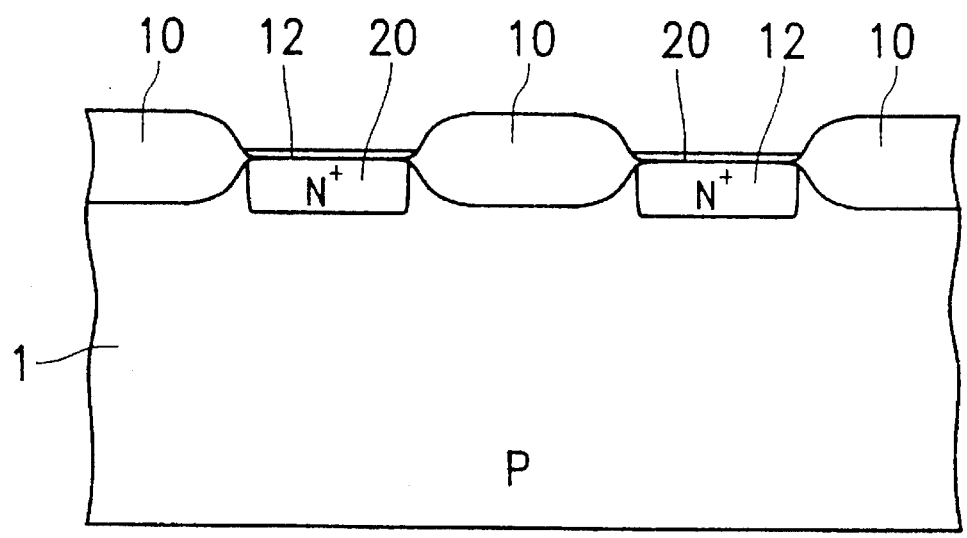
FIG. 3 shows the cross-sectional view of the conventional prior art non-volatile memory of FIG. 1 taken along the III—III line.
Figure 4:
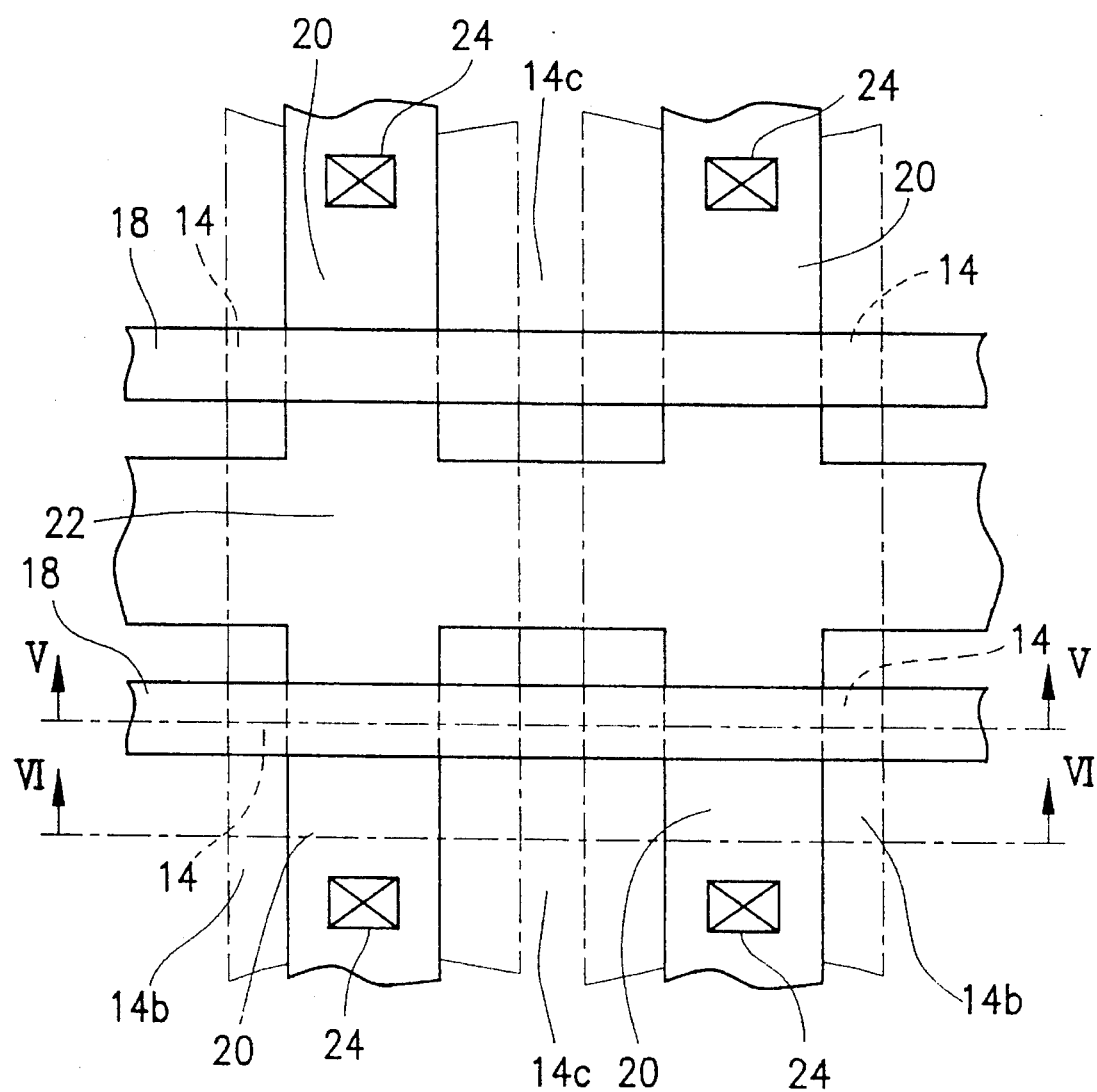
FIG. 4 is a plan view of a non-volatile memory containing memory cells fabricated in accordance with the method of a preferred embodiment of the present invention.

Referring to FIGS. 4, 5a–5g and 6 of the drawing, a preferred embodiment of the method for fabricating isolation for memory cells in accordance with the present invention is shown. The Figures depict an embodiment with a P-type semiconductor substrate. Those skilled in the art can similarly implement the invention using the counterpart N-type substrate. The same reference numeral in all the drawings designates the same or similar component in both the exemplified embodiment and the compared prior art memory device.

Stage 1

Figure 5A:
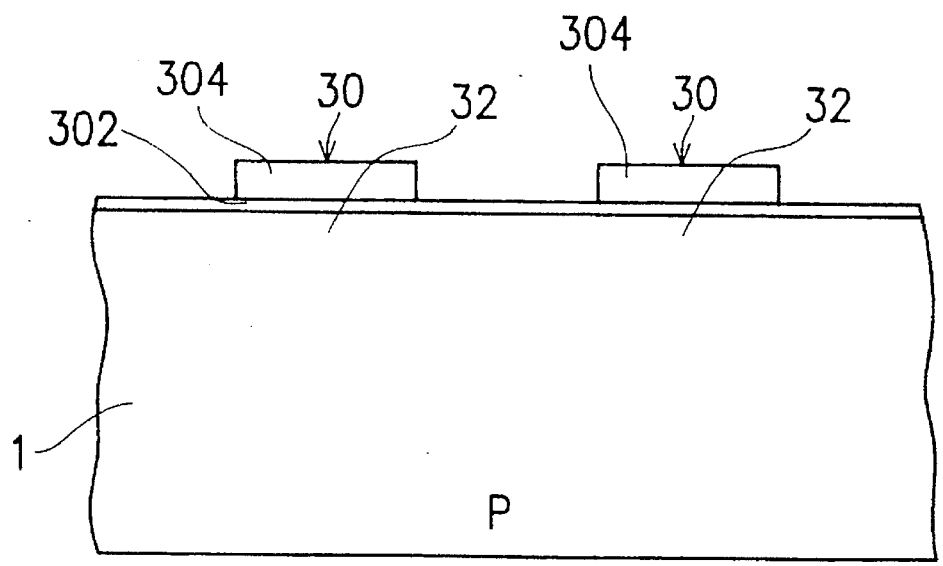
FIGS. 5a–5g show the cross-sectional views, at the selected fabrication process stages, of the non-volatile memory of the present invention as taken along the V—V line in FIG. 4.

In FIG. 5a, P-type semiconductor substrate 1 is subjected to procedures such as photomasking to define and produce masking layer 30, which in turn defines active regions 32 for the memory cells. This is done by first applying an oxidation procedure to the surface of the substrate 1, so as to form base oxide layer 302 having a thickness of about 300 Å. A process of deposition is then conducted to deposit nitride layer 304 having a thickness of about 1,500 Å. A photolithography procedure is then conducted to form the masking layer 30 by etching away the undesired portions of nitride layer 304.

Stage 2

Figure 5B:
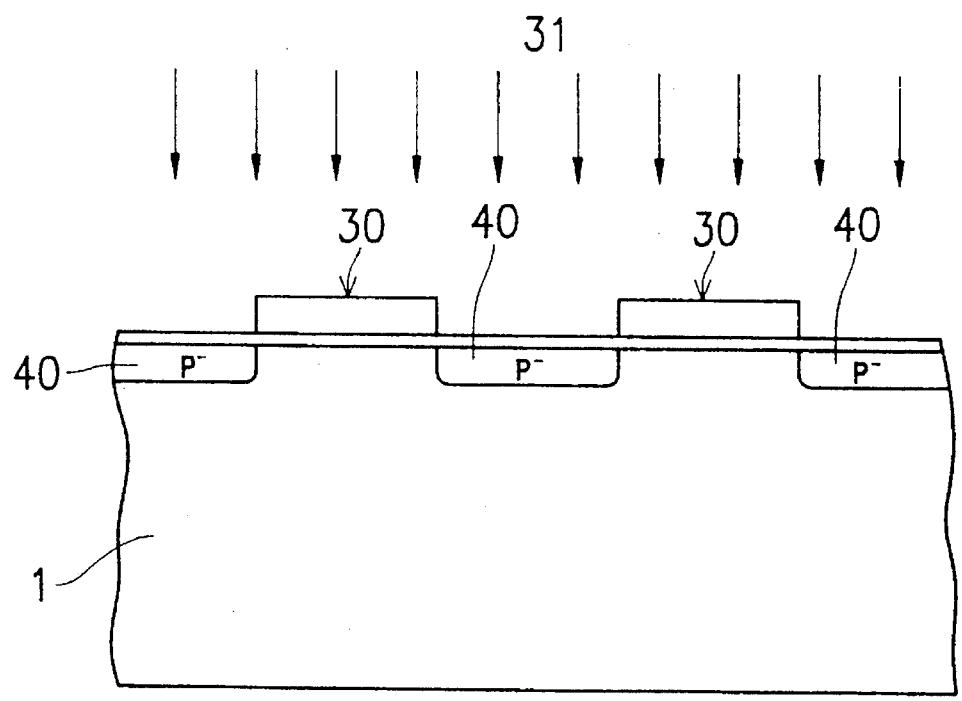

In FIG. 5b, masking layer 30 is utilized as a masking shield for implanting P-type impurities (as depicted by arrows 31) into the desired depths of P-type substrate 1 at the defined regions. As a result of this controlled implantation procedure, lightly-doped P– implantation regions 40 are formed in the regions of substrate 1 not shielded by masking layer 30. The implanted P– impurities in implantation regions 40 may be, for example, B and $BF_2$, with a dose of about $1\times10^{12}$ to $2\times10^{13}$ atoms/cm$^2$.

Stage 3

Figure 5C:
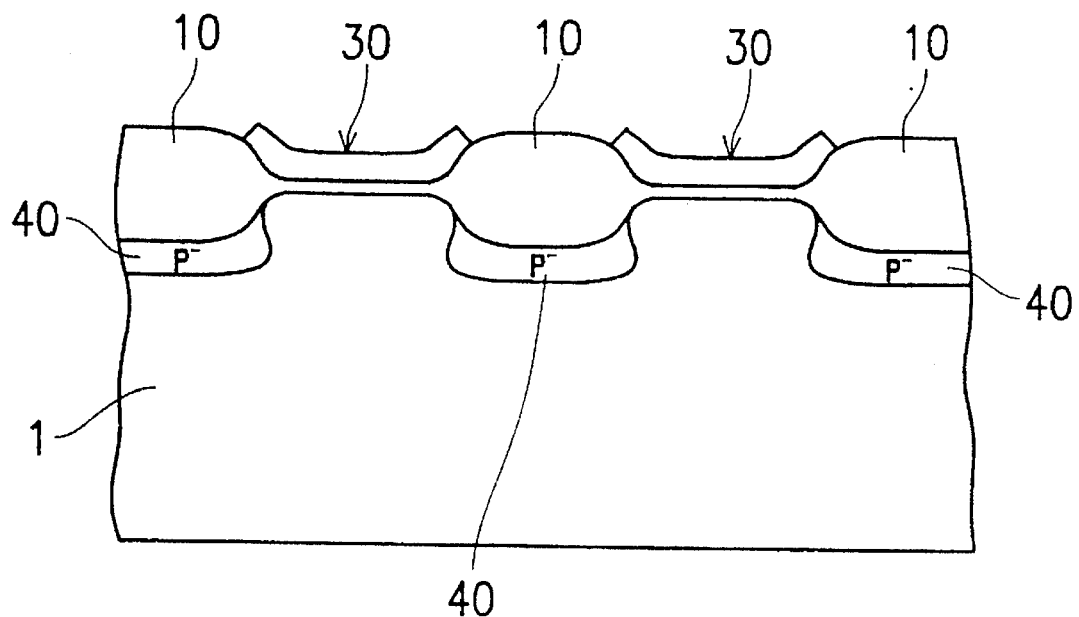

In FIG. 5c, masking layer 30 is then utilized as a mask for selective oxidation of the surface of the semiconductor device. As a result, field oxide layers 10 for the memory cells are formed on top of lightly-doped P– implantation regions 40 between masking layers 30. Field oxide layer 10 has a thickness of about 3,000–9,000 Å.

At this moment, masking layer 30 can now be removed by procedures known in the art. The concentration of the P– impurities in implantation regions 40 will reduce during the oxidation process, since portions of the P– impurities will diffuse into field oxide layers 10 directly above.

Stage 4

Figure 5D:
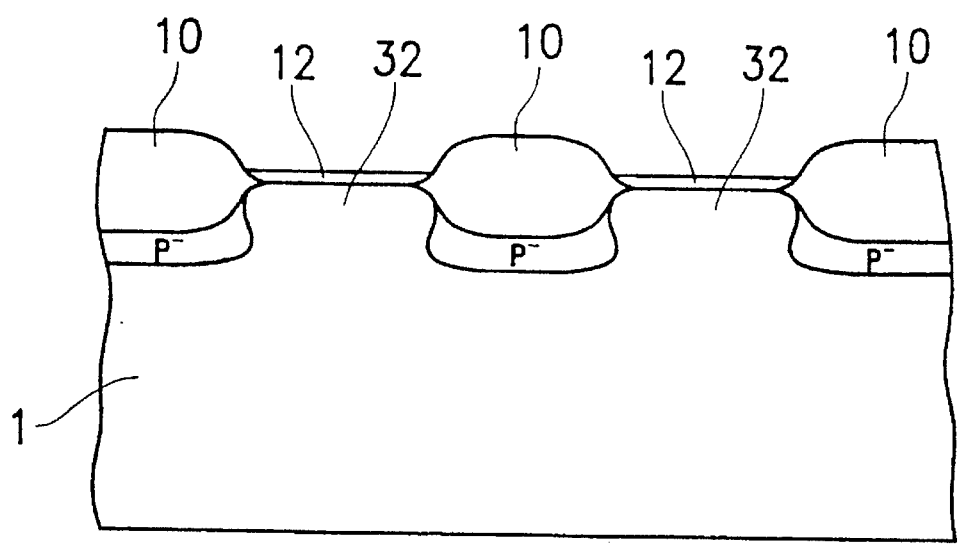

Then in FIG. 5d, another oxidation procedure is utilized to form thin oxide layer 12 on active regions 32. The thickness of the oxide layer 12 is varied depending on the desired device structure. If formed thin oxide layer 12 has a thickness of about 150–200 Å it can become the gate oxide layer of a MOS transistor device. If its thickness falls in the range of a thickness of about 60–150 Å it can become the tunnel oxide layer of a floating gate transistor device. However, in this embodiment, a floating gate transistor device is fabricated.

Stage 5

Figure 5E:
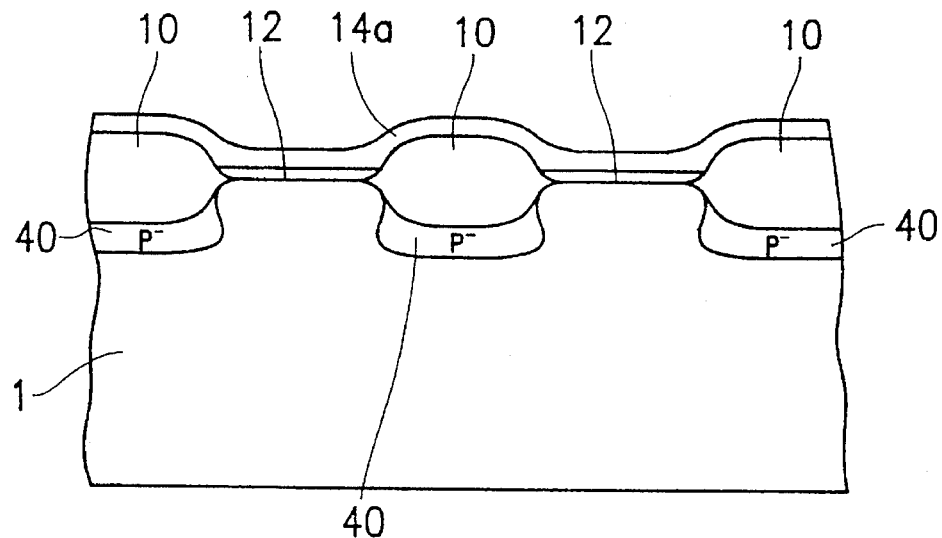

Referring to FIG. 5e, thin oxide layer 12 and field oxide layer 10 of the memory cells are then covered by polysilicon layer 14a. Polysilicon layer 14a may be formed, for example, by a deposition procedure that deposits polysilicon material, such as CVD.

Stage 6

Figure 5F:
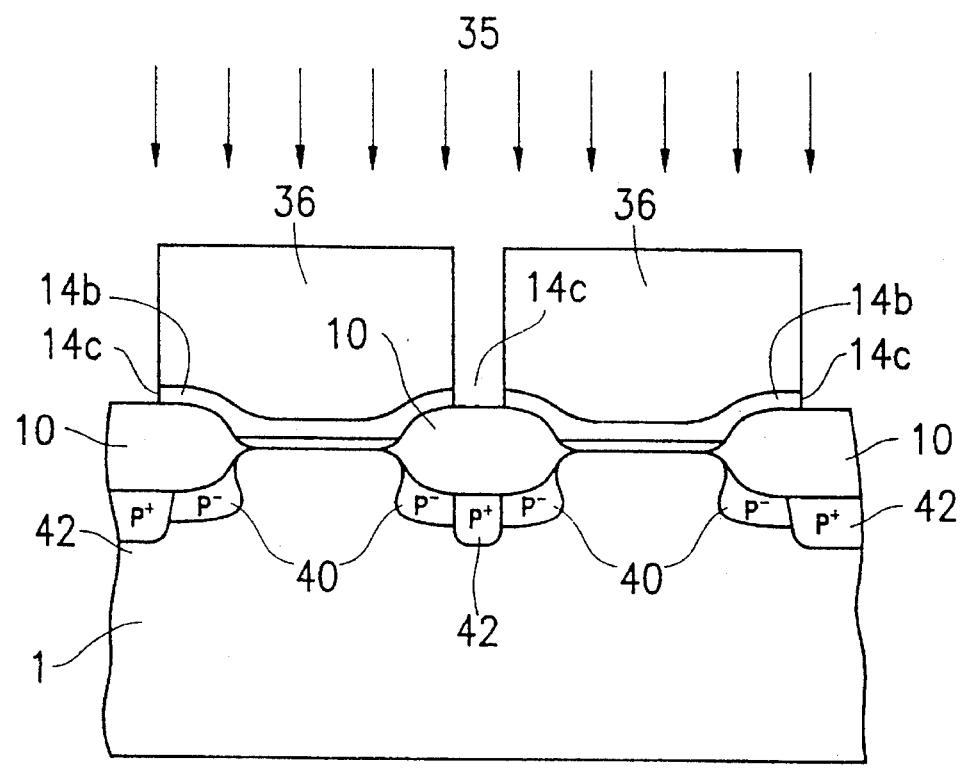

In FIG. 5f, polysilicon layer 14a that covers the entire memory cell at this stage is then subjected to a photomasking procedure to define isolated floating gate strip layers 14b by etching away portions of polysilicon layer 14a. In the cross-sectional view taken along the V—V line in the plan view of the completed memory device (FIG. 4), one of these floating gate strip layers 14b appears as continuous thin layer 14b. One such continuous floating gate strip layer is identified in FIG. 4 as a vertical column designated by phantom lines. As is also obvious in FIG. 4, discontinuous trenches 14c that separate strip layers 14b appear also as vertical columns between two neighboring strip layers 14b.

The isolated floating gate configuration is obtained by first applying layer of photoresist 36 covering polysilicon layer 14a. Photoresist layer 36 is then subjected to exposure processing to define the necessary pattern. An etching process is then conducted to remove undesired portions in polysilicon layer 14a, forming trenches 14c that divide polysilicon layer 14a into the above-mentioned independent floating gate strip layers 14b. Each of the trenches 14c is aligned on top of field oxide layer 10, and has a width that allows floating gate layer 14 to extend from gate oxide layer 12 onto field oxide layer 10.

Next, photoresist layer 36 is utilized again as a shield for implementing an impurity implantation procedure. P-type impurities, for example, boron, are implanted (as depicted by arrows 35), forming heavily-doped P$^+$ impurity regions 42 under field oxide layers 10. To achieve the formation of such impurity regions 42 at the required depth, the implantation is conducted with an implantation energy level of about 150 keV. The dose can be selected to be about $1\times10^{13}$ to $5\times10^{13}$ atoms/cm$^2$.

Stage 7

Figure 5G:
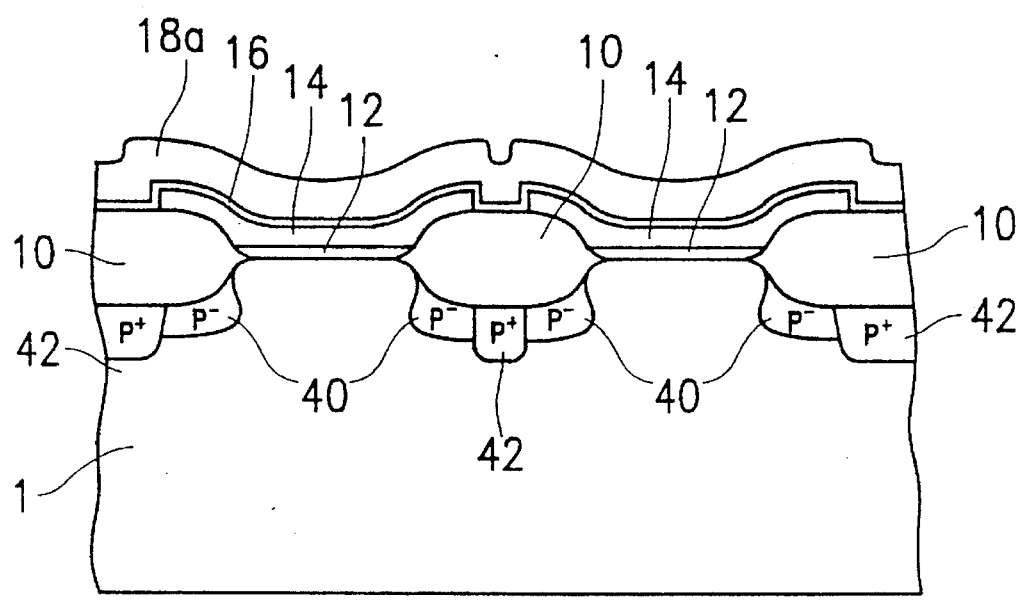
Figure 6:
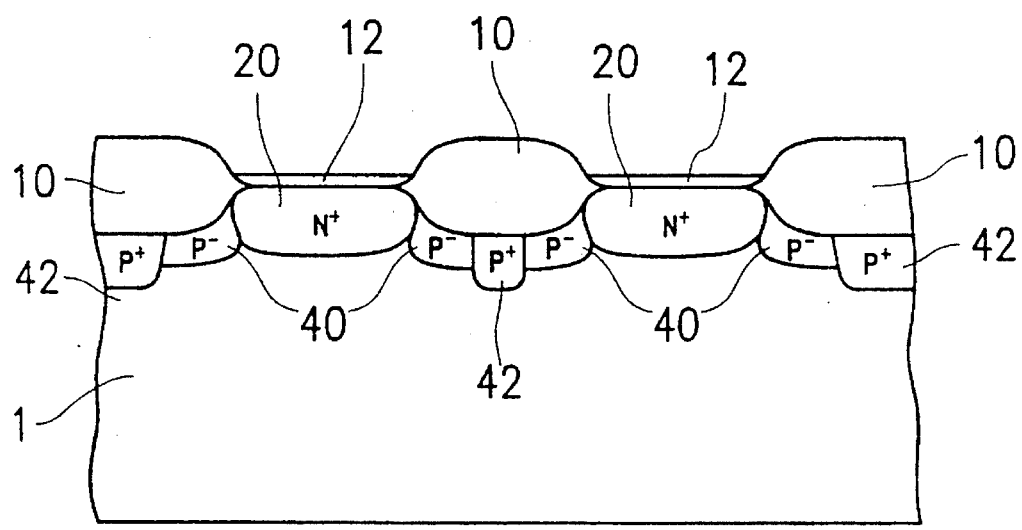
FIG. 6 shows the cross-sectional view of the non-volatile memory containing memory cells fabricated in accordance with the method of the present invention as taken along the VI—VI line in FIG. 4.

As is shown in FIG. 5g, after P$^+$ impurity region 42 is formed at the desired depth in substrate 1, photoresist layer 36 can be removed. Gate dielectric layer 16, preferably of an oxide-nitride-oxide (ONO) configuration, is then formed thereon, followed by the formation of word line layer 18a, preferably by depositing a layer of polysilicon material.

Word line layer 18a, gate dielectric layer 16, and floating gate strip layers 14b are subsequently subjected to etching procedures to form word lines 18. During this process, as persons skilled in the art can appreciate, all regions of the layers 18a, 16, and 14b not being covered by the photomask defining word lines 18 can be etched away within one etching procedure.

Of note is that the layers subjected to etching for the formation of word line 18 includes gate dielectric layer 16, word line layer 18a, and the exposed portions of floating gate strip layer 14b. In other words, isolated floating gates 14 of the memory cells are not formed until after the formation of word lines 18. Each of the floating gates 14 of the memory cells now lies completely covered by a word line 18. This is shown in the plan view FIG. 4 of the completed memory device.

Stage 8

Thus, up to this stage, the primary components for the memory cells of the non-volatile mass memory array can be considered to be ready. However, before the entire structural configuration of the memory cells can be considered complete, the word lines 18 are utilized as masks for implementing N-type impurities on both sides of active regions 32 for forming drain regions 20 and source regions 22 for the memory cells. The drain and source regions are also identified in FIG. 4. Finally, vias 24 for providing connections to the bit lines of the memory cells can be formed for the later formation of metal bit lines.

The structural configuration for the memory cells of the non-volatile memory device, which, as fabricated in accordance with the preferred embodiment of the present invention as described above, is characterized by the formation of lightly-doped $P^-$ regions 40 underneath field oxide layers 10. The presence of lightly-doped $P^-$ regions 40 in this location of the memory cell helps to greatly increase the breakdown voltage for junction in the parasitic transistors. Moreover, the formation of additional heavily-doped $P^+$ regions 42 among each of the lightly-doped $P^-$ regions 40, on the other hand, results in the increased threshold and punchthrough voltages for the inherent parasitic transistors of the structural configuration of the memory device.

The combination of the lightly- and heavily-doped regions in the device substrate, as featured by the present invention, can provide effective isolation between the memory cells by improving the breakdown voltage as well as the threshold and punchthrough voltage characteristics of the inherent parasitic transistor. This memory cell isolation, moreover, is achieved without increasing the device dimension. Promoting the memory cell isolation without increasing the device dimension indicates the fact that the present invention is more suitable for fabricating high density memory devices.

Although the present invention of the method for isolating memory cells of non-volatile memory devices has been described based on the specific embodiment featuring specific conditions in, for example, dimensions of the preferred embodiment, it is, however, apparent to persons skilled in the art that the present invention is not limited thereto. Modifications to the exemplified material and process conditions can be made without departing from the scope of the disclosed invention, which is defined in the claims section that follows.

I claim:

1. A method of fabricating semiconductor integrated circuit non-volatile memory cells having memory cell isolation comprising the steps of:

defining active regions of said memory cells on a semiconductor substrate of a first conductivity type by forming a masking layer, said masking layer leaving exposed regions of the semiconductor substrate;

implanting impurities of the first conductivity type into said semiconductor substrate to form lightly-doped regions of the first conductivity type in the regions exposed by said masking layer;

utilizing said masking layer as shielding for an oxidation procedure of said semiconductor substrate to form field oxide layers of said memory cells on top of said lightly-doped regions of the first conductivity type;

removing said masking layer;

forming an oxide layer on top of said active regions of said memory cells;

forming floating gate strip layers for said memory cells each on top of one of said field oxide layers and said oxide layer, wherein said floating gate strip layers are divided by isolating trenches and aligned on top of said oxide layers with edges extending outwardly to cover a portion of the width of said field oxide layers;

implanting impurities of the first conductivity type through said isolating trenches between said floating gate strip layers to form heavily-doped regions of the first conductivity type in said semiconductor substrate, said heavily-doped regions being formed within said lightly-doped regions located underneath said field oxide layers;

forming subsequently on top of said substrate a gate dielectric layer and word line polysilicon layer and implementing an etching procedure against said gate dielectric and word line polysilicon layers to form independent word lines and isolated floating gate layers, said floating gate layers being covered by said word lines; and implanting impurities of a second conductivity type into said active regions utilizing said word lines and field oxide layers as masks to form drains and sources for said memory cells.

2. The method of fabricating semiconductor integrated circuit non-volatile memory devices having memory cell isolation according to claim 1, wherein said first conductivity type is P type, and said second conductivity type is N type.

3. The method of fabricating semiconductor integrated circuit non-volatile memory devices having memory cell isolation according to claim 1, wherein said first conductivity type is N type, and said second conductivity type is P type.

4. The method of fabricating semiconductor integrated circuit non-volatile memory devices having memory cell isolation according to claims 1, wherein said masking layer comprises an oxide and nitride layer.

5. The method of fabricating semiconductor integrated circuit non-volatile memory devices having memory cell isolation according to claim 1, wherein said oxide layer is a gate oxide layer of said memory cells.

6. The method of fabricating semiconductor integrated circuit non-volatile memory devices having memory cell isolation according to claim 1, wherein said oxide layer is a tunnel oxide layer of said memory cells.

7. The method of fabricating semiconductor integrated circuit non-volatile memory devices having memory cell isolation according to claim 1, wherein said floating gates and word lines comprise polysilicon.

* * * * *